United States Patent [19]
Cerofolini et al.

[11] Patent Number: 6,087,729
[45] Date of Patent: Jul. 11, 2000

[54] LOW DIELECTRIC CONSTANT COMPOSITE FILM FOR INTEGRATED CIRCUITS OF AN INORGANIC AEROGEL AND AN ORGANIC FILLER GRAFTED TO THE INORGANIC MATERIAL

[75] Inventors: Gianfranco Cerofolini; Giorgio De Santi, both of Milan; Giuseppe Crisenza, Trezzo sull'Adda, all of Italy

[73] Assignee: SGS-Thomson Microelectronics S.r.l., Agrate Brianza, Italy

[21] Appl. No.: 09/062,378

[22] Filed: Apr. 17, 1998

[30] Foreign Application Priority Data

Apr. 28, 1997 [EP] European Pat. Off. .............. 97830194

[51] Int. Cl.$^7$ ................................. H01L 23/485
[52] U.S. Cl. ............................. 257/760; 257/759
[58] Field of Search ....................... 257/759, 760

[56] References Cited

U.S. PATENT DOCUMENTS

| | | | |
|---|---|---|---|
| 5,523,615 | 6/1996 | Cho et al. | 257/632 |
| 5,661,344 | 8/1997 | Havemann et al. | 257/758 |
| 5,789,819 | 8/1998 | Gnade et al. | 257/759 |
| 5,942,802 | 8/1999 | Aoi | 257/759 |

FOREIGN PATENT DOCUMENTS

| | | | |
|---|---|---|---|
| 0 512 401 A2 | 11/1992 | European Pat. Off. | .......... H01B 3/30 |
| 0 667 324 A1 | 8/1995 | European Pat. Off. | ...... C04B 35/624 |

OTHER PUBLICATIONS

Hrubesh et al., "Dielectric Properties and Electronic Applications of Aerogels", *Chemical Abstracts*, vol. 123, No. 10, Sep. 4, 1995, Abstract No. 129392s, p. 1279.

*Primary Examiner*—John Guay
*Attorney, Agent, or Firm*—Theodore E. Galanthay; Allen, Dyer, Doppelt, Milbrath & Gilchrist, P.A.

[57] ABSTRACT

An insulating film between stacked electrically conducting layers through which interconnections of integrated circuits are realized, is formed of an aerogel of an inorganic oxide on which organic monomers have been grafted under inert ion bombardment and successively further incorporated in the aerogel to fill at least partially the porosities of the inorganic aerogel. The composite dielectric material is thermally stable and has a satisfactory thermal budget. The method of forming an aerogel film includes the spinning of a precursor compound solution onto the wafer followed by supercritical solvent extraction carried out in the spinning chamber.

9 Claims, No Drawings

LOW DIELECTRIC CONSTANT COMPOSITE FILM FOR INTEGRATED CIRCUITS OF AN INORGANIC AEROGEL AND AN ORGANIC FILLER GRAFTED TO THE INORGANIC MATERIAL

FIELD OF THE INVENTION

The present invention relates to techniques for forming insulating films between stacked conducting layers through which interconnecting electrical contacts or vias are realized, and, more particularly, to such techniques for fabricating integrated circuits having a high density of integration.

BACKGROUND OF THE INVENTION

The realization of electrical interconnecting contacts and vias is generally recognized as having an important role in the evolution of integrated circuits. Already with present state of the art integration technology of 0.35 $\mu$m, the values of time constants (RC) (delays) attributable to the interconnection resistance and capacitance has risen above those intrinsic to the gate of an active component of the circuit. This situation is destined to worsen with the continuous reduction of the size of electronic devices. In addition, the complexity of integrated circuits will impose a drastic increase on the complexity of interconnecting. With the present materials, an analysis of a hypothetical 0.15 $\mu$m technology would require ten interconnecting metal levels. This number is hardly compatible with the costs that would make such a technological development a viable one.

According to present industry trends, the development of integrated circuits demands the identification of new materials or structures capable of reducing the complexities of the required electrical interconnections. Eminently, the target is that of finding conductors of lower resistivity (p) than those presently in use, as well as dielectrics with a dielectric constant (K) lower than that of silica ($SiO_2$) which is by far the most common dielectric used in integrated circuits and whose k is about 3.9.

To give a clearer picture of the simplification obtainable with new materials, it will be sufficient to realize that replacing Al with Cu for the metal layers and substituting $SiO_2$ with a dielectric whose constant is $K \leq 2$, would allow the implementation of a 0.15 $\mu$m integration technology with only five interconnection metal levels, rather than the ten necessary with today's materials.

While the R&D hypothesis as far as the metallic materials are concerned identifies the use of copper as a way to achieve an appreciable improvement, it is in the field of the dielectrics where "targets" with a more accentuated margin of improvement than that obtainable through a reduction of the resistivity, have been identified. The development approaches of suitable dielectrics may be classified in three main groups.

Fluorinated Oxides

It is known that by fluorinating $SiO_2$ its refraction index, and, therefore, its dielectric constant may be reduced significantly. However, the concentration of fluorine required for reducing the value of K down to about 3.0 is rather high and this is accompanied by a significant reduction of the mechanical and chemical characteristics of silica. The Si—F bond is easily hydrolyzed provoking a release of HF which strongly reacts with many metals (explosively with aluminum). This approach presents serious incompatibilities with the structure of integrated circuits and with their fabrication processes.

Plastics

The use of plastic materials as dielectrics does not represent in itself an innovation. Polyimide has been used for some time in commercial products. There are polymers with a dielectric constant ($K \leq 2$) even though in general there exists a correlation whereby the higher the value of K, the greater the thermal stability of the polymer (and thus its compatibility with the conditions that are normally encountered in fabrication process of integrated circuits). At present, polymers under investigation possess a dielectric constant ranging between 2.0–2.5 for fluoropolymers and 2.9–3.5 for aromatic polyimides, but their thermal "budget" remains unsatisfactory if compared to the minimum requirement of about 450° C. for 30 min. Their use remains dependent upon the development of fabrication techniques for integrated circuits at decisively lower temperatures than the present ones.

Aerogel

Aerogels are very low density dielectric materials obtainable by the gelling of solutions (in short sol-gel) like, for example, a TEOS (($C_2H_5O)_4Si$) solution in alcohol, followed by supercritical solvent extraction. This offers, in theory, an interesting margin of reduction of the dielectric constant with respect to the value of the same material in a condensed phase.

Indeed, the dielectric constant K is known to vary, in the approximation of effective medium, with the density of the material. Since it is possible, through a sol-gel technique, to deposit materials with a density of about three orders of magnitude lower than that of the condensed phase (atomic density of the material), it appears to be theoretically possible to prepare materials, for example $SiO_2$, with a particularly low dielectric constant K, by reducing its density.

The idea of using an aerogel of $SiO_2$, which is one of the inorganic dielectric materials with a lower intrinsic dielectric constant, or for reasons of isomorphism or other reasons, of a different inorganic oxide such as $GeO_2$, $TiO_2$, $Al_2O_3$ and the like, as insulating material between superimposed conductor layers of integrated circuits, has until now been faced with a series of seemingly insurmountable problems. These problems range from the inability of forming a submicrometric film of aerogel having homogeneity and continuity characteristics demanded by the specific use, to that of ensuring an efficient encapsulation of the aerogel film to prevent absorption of gas and vapors that would diminish their dielectric capabilities. A further problem is that of overcoming the intrinsic characteristic, rather disadvantageous for such a hypothesized use of an aerogel film, which is represented by its very low thermal conductivity if compared to that of the condensed phase. As a matter of fact, in an integrated circuit it is essential to promote heat dissipation and this decisively contrasts with this probably most evident characteristic of an aerogel.

The sol-gel deposition technology was and is being used with success in fabrication process of optical supports in photonic instrumentation and in the fabrication of integrated optical devices. In fact, this technique has opened new horizons in the fabrication of optical glasses with graded characteristics and miniaturized optical waveguides of great precision.

The volume entitled: "Chemistry for innovative materials" by G. F. Cerofolini, R. M. Mininni and P Schwartz, Enichem Milano (1991), contains, in chapter 2, a description of the sol-gel technology including optical applications of aerogels. Chapter 3 of the same volume presents an extensive account of those fields of application and functions for the implementation of which a very low density solid structure obtainable by sol-gel deposition conventionally referred to as "aerogel" should perform much better than conventional solid structures. These improved performances would be due either by exploiting the very low atomic density of aerogel layers or by assuming their activation by way of irradiation/bombardment processes in controlled atmospheres, capable of generating through the effects of irradiation damage and of an eventual reaction with organic molecules, functional groups grafted to the inorganic skeleton and capable of conferring particular properties to the aerogel.

The extremely low thermal conductivity of low density of aerogel structures, together with their transparency, have suggested their use in the field of thermal isolation, such as in the form of a superisolating and transparent layer of transparent laminates for windows, solar panels, greenhouses, etc.

A great number of tests in this field have been undertaken using silica ($SiO_2$) as the base material. A catalytic activity of $SiO_2$ in a highly dispersed form and subjected to ion-bombardment has already been demonstrated. While the defects inducible through ion-bombardment in condensed $SiO_2$ are relatively unstable, in the case of an $SiO_2$ aerogel that may be represented as a polymeric structure composed of randomly oriented coiled chains, each chain being formed by tetrahedrons of Si(O—)4, occasionally terminating with OH groups, make the defects induced by the bombardment much more difficult to recover than in the condensed material. And to a certain extent the nature and distribution of the induced defects are tightly correlated to the nature and distribution of native defects of the aerogel siliceous skeleton.

Such a large number and relative stability of defects that may be induced in an aerogel structure of silica would appear to form the base of a durable reactivity of an irradiated aerogel that is instrumental to favor the formation of chemical bonds with other substances or compounds either of inorganic or organic nature.

A hypothetical application of $SiO_2$ aerogel as a dielectric material for fabricating integrated circuits, besides the above mentioned problems and drawbacks, would also suffer from the fact that an $SiO_2$ aerogel is a substantially metastable structure. The metastable structure abruptly collapses to a stable state (condensed) upon the occurrence of conditions that destroy the polymeric Si—O bonds existing among Si(O—)4 tetrahedrons. These conditions are easily determined by overheating beyond a certain temperature and/or by exposing the bounds to cleavage as a result of either a heavy irradiation or chemical aggression.

For the above reasons aerogels have not found yet any practical application in the industry of integrated circuits, though being theoretically capable of offering a dielectric constant that is lower than that of the best dielectric presently used, that is to say, a chemically deposited $SiO_2$ from vapor phase or thermally grown silicon oxide.

SUMMARY OF THE INVENTION

It has now been found and provides the object of the present invention, a composite dielectric material that significantly overcomes the above noted problems of aerogels and of plastics while exhibiting a dielectric constant lower or equal to 2. The composite dielectric material of the invention is perfectly stable up to temperatures exceeding 500° C. and possesses a remarkable thermal conductivity. These are characteristics that make it exceptionally suited as an insulating dielectric film in a stack of electrically conducting layers in an integrated circuit, and also as a so-called passivating layer.

The composite dielectric material of the invention is provided by a highly porous structure of an inorganic aerogel of a low dielectric constant oxide, preferably of silica, on to which organic monomers are grafted so as to fill, at least partially, the porosity of the aerogel.

The essential grafting of organic monomers to the inorganic material (dielectric oxide) is obtained by subjecting the aerogel to a bombardment with ions of an inert gas in an atmosphere containing the organic monomers. The bombardment with inert gas ions, apt to provoke a multiple two-body elastic collisions ion arresting mechanism (or cascade collisions) in the aerogel oxide structure, produces the dislocation of atoms of the polymeric structure of the aerogel oxide with a consequent rearrangement of chemical bonds at the collision site. This also creates, after the relaxation is completed, a defect whose nature depends upon the polymeric inorganic material and on the structural peculiarity of the collision site.

Contrary to what would occur in a corresponding condensed phase, where the dislocated atoms would remain in the proximity of its original position so to predispose an instability of the temporarily created defect by the collision with the accelerated ion, in the exceptionally dispersed structure of the aerogel, a formation of defects of a radical character takes place capable of reacting with the molecules of the atmosphere. By an appropriate choice of the bombardment atmosphere it is possible to graft to the aerogel, that is, to the radical sites created by the collision, molecules present in the atmosphere, and thereby confer to the aerogel certain desired properties by also grafting organic monomers thereto.

An important adsorption of monomers by the monomer grafted aerogel is observed when, after the step of monomers implantation (or grafting) on the inorganic polymeric structure represented by the oxide aerogel under inert ion bombardment at pressures of about $10^{-5}$ Torr, the composite is kept in a controlled atmosphere containing the monomers. The controlled atmosphere is at a pressure that gradually increases towards the atmospheric pressure and in the absence of ion bombardment. By analyzing the composite, the existence of covalent bonds is observed which indicates the existence of bonds established with radical groups induced by the irradiation, as well as a possible formation of organic polymeric molecules.

Even though an apparent growth mechanism of organic polymeric chains on monomers grafted to the inorganic skeleton of aerogel oxide is yet to be demonstrated, it would appear plausible and the formation of organic polymeric chains would explain the unusual and outstandingly effective characteristics exhibited by the composite.

Whether or not a growth of organic polymeric chains, in a casually competitive manner, in the interstices of the aerogel porous skeleton after the ion bombardment in a monomer atmosphere step is assumed, or that the monomers absorbed after interrupting the ion-bombardment bond themselves to the inorganic structure in correspondence of native defects and/or defects induced by the ion bombardment, the resulting material is a composite structure. In the composite structure, a pre-existing structural continuity of the aerogel is associated with an organic monomeric/polymeric interstitial phase that presents a high density of direct bonds with the inorganic material of the aerogel. The result is an aggregate or composite that comprises a skeleton or porous inorganic matrix defined by the aerogel structure and an interstitial organic phase, which is intimately (chemically) bounded to the inorganic polymeric matrix.

The incorporation of a suitable monomer/polymer in the aerogel inorganic lattice confers to the resulting composite, on one hand, an exceptionally augmented thermal stability of the organic molecules up to temperatures much higher than those tolerated by the same organic molecules per se, and stabilizes the aerogel itself effectively preventing its collapse. On the other hand, the grafting and incorporation of the organic substance in the aerogel imports to the composite a thermal conductivity close to the thermal conductivity exhibited by the organic material in a normal condensed state.

These synergisms or mutualities of the two phases that constitute the composite: inorganic aerogel and organic "filling", are exceptionally effective in compensating the reciprocal deficiencies and drawbacks towards the fulfillment of the requisites of thermal conductivity, stability at temperatures higher than 500° C. and adequate thermal budget imposed by compatibility considerations with the fabrication processes and the functioning conditions of integrated circuits.

A composite material of the invention, based upon an inorganic structure of very low apparent density, which may range between 0.002 and 1 $g/cm^3$, for example an $SiO_2$ aerogel having an apparent density of about 0.2 $g/cm^3$, filled through an ion bombardment treatment with ethylene monomers and successively subjected to adsorption and incorporation of an effective amount of such monomers to reach an apparent density of about 1.0 $g/dm^2$, presents a dielectric constant of a value close to 2. The thermal conductivity is between 3 and $7\times10^{-4}$ cal/s cm° C. which is significantly near that of polyethylene. The composite is stable up to and beyond 500° C., while its thermal budget at 500° C. exceeds 60 minutes.

From preliminary tests, it would appear possible to further increase the maximum bearable temperature and the thermal budget of the dielectric silica aerogel/organic filling composite using perfluorinated monomers. The use of entirely fluorinated monomers, such as, for example tetrafluoroethylene, already used during the grafting phase to the siliceous structure under ion-bombardment, is highly preferred.

Other oxides depositable through a sol-gel process in the form of a low density aerogel, such as for instance: $GeO_2$, $TiO_2$, $Al_2O_3$ and the like, may be employed in a mixture with or in substitution of $SiO_2$. Even for these different oxides, the ion bombardment with inert ions is able to generate radical groups as a consequence of the radiation damage suitable for the chemical bonding of organic monomers thereto.

The bonding (grafting) of monomers on the inorganic skeleton represented by the aerogel is carried out under ion-bombardment by using for example a stream of accelerated argon ions of $1\times10^{14}$ to $1\times10^{15}$ atoms of $Ar/cm^2$. Higher stream densities would tend to reduce the effects of the bombardment probably because of an increasingly destruction of defects radical groups and for bonds already created. For a relatively thin aerogel film, with a thickness comprised between 0.5 and 3.0 $\mu$m, the average kinetic energy of the accelerated ions may be between 30 and 200 KeV.

Formation Process of a Dielectric Film

The substrate onto which an insulating dielectric composite layer of the invention can be formed may be a conductor layer, for example, a second level polycrystalline silicon, or an aluminum-silica alloy or other metal that commonly provides the different levels of metallization layers (metal). The nature of the substrate conductor material has practically no influence on the formation process of the composite dielectric layer of the invention.

The sol-gel cycle depends on the precursors compounds that are used. The so-called TEOS (tetraethyl-ortho-silicate) and TMOS (tetra-methyl-ortho-silicate), respectively, in an ethyl or methyl solution, are the preferred starting solutions. The gelling of the solution may be carried out, for example, by adding water to the alcohol solution. Through a hydrolysis and polycondensation process, a metastable and highly reticulated polymeric structure may be produced in the solution that is kept relatively open by steric restraints due to the incorporation of solvent molecules.

The gelled solution may be fed drop-by-drop onto the surface of a wafer held on a turntable of a spinning machine commonly used for forming an exposable resist film on the wafers. A "Spinner" machine, manufactured by TOKYO-OKHA or by SEMIX may be used satisfactorily after having modified the work chamber of the machine to make it suitable to withstand a pressurization of up to at least 3 atmospheres and providing it with a controlled temperature variation system, with a solvents exhaustion system and with gas inlet ports.

The supercritical solvent extraction must in fact take place in coordination with the distribution of the gelled solution onto the surface of the wafer by centrifugal action. The gel spinning and hypercritical drying conditions must be accurately and dynamically coordinated among each other to ensure a good uniformity of the thickness of the aerogel film formed onto the wafer surface, an account of the fact that rheologic characteristics of the gel are modified by the hypercritical drying of the gel itself which must occur immediately after its distribution on the wafer surface.

The thickness of the aerogel film formed on the wafer surface may range between 0.5 and 1 $\mu$m. The wafer covered with the aerogel film is then transferred to a ion implanter eventually modified, to allow irradiation with accelerated argon ions with an energy adjustable between 30 and 200 Kev and capable of producing a stream of up to $110^{15}$ atoms of $Ar/cm^2$. Irradiation of the aerogel film is protracted for a period of time of generally between 20 sec. and several minutes (2–3), while feeding ethylene or tetra-fluorethylene in the chamber at room temperature or in any case at a temperature not exceeding 120–150° C.

After stopping the ion-bombardment, the temperature in the chamber is gradually increased to about 300–450° C. while continuing to feed ethylene or tetrafluoroethylene in the chamber at a rate so as to gradually increase the pressure from about $10^{-5}$ Torr, that was maintained during the irradiation, up to reach the atmospheric pressure level or even higher, in a time that may vary between 5 to 30 minutes or even longer. At the end of this step, the wafer appears covered by a composite film of aerogel and organic molecules of ethylene or of tetrafluoroethylene, the apparent density of which reaches a value in the order of 1 $g/cm^3$.

Onto the dielectric composite film so formed may be deposited, by a common sputtering technique, a conductor film similar or different from the substrate conductor, for example an alloy of aluminum-silicon. The dielectric characteristics of the composite film of the invention thus produced present a dielectric constant lower or equal to 2, a thermal budget higher than 500° C./hr and a breakdown voltage higher than 1.5 MV/cm. The dielectric film has a thermal conductivity higher than 3×10 cal/s cm° C.

What is claimed is:

1. An integrated circuit comprising:

stacked electrically conductive layers;

an insulating layer between the stacked electrically conducting layers; and interconnections extending through the insulating layer;

said insulating layer comprising an aerogel including an inorganic dielectric oxide material and organic monomers grafted to the inorganic dielectric oxide material.

2. An integrated circuit according to claim 1, wherein said inorganic dielectric oxide material comprises $SiO_2$.

3. An integrated circuit according to claim 1, wherein said organic monomers comprise $C_2H_4$.

4. An integrated circuit according to claim 1, wherein said organic monomers comprise $C_2F_4$.

5. An integrated circuit according to claim 1, wherein said aerogel comprises a skeleton formed from the dielectric oxide material defining porosities therein; and wherein a quantity of said organic monomers is sufficient to fill, at least partially, the porosities of the skeleton.

6. An integrated circuit comprising:

stacked electrically conductive layers;

an insulating layer between the stacked electrically conducting layers; and interconnections extending through the insulating layer;

said insulating layer comprising an aerogel including a skeleton of inorganic dielectric oxide material defining porosities therein and organic monomers grafted to the inorganic dielectric oxide material to at least partially fill the porosities.

7. An integrated circuit according to claim 6, wherein said inorganic dielectric oxide material comprises $SiO_2$.

8. An integrated circuit according to claim 6, wherein said organic monomers comprise $C_2H_4$.

9. An integrated circuit according to claim 6, wherein said organic monomers comprise $C_2F_4$.

* * * * *

UNITED STATES PATENT AND TRADEMARK OFFICE
CERTIFICATE OF CORRECTION

PATENT NO. : 6,087,729
DATED : July 11, 2000
INVENTOR(S) : Cerofolini, De Santi, Crisenza It is certified that error appears in the above-indentified patent and that said Letters Patent is hereby corrected as shown below:

On the title page: Item [54] Title and Column 1,

In the Title  Delete: "LOW DIELECTRIC CONSTANT COMPOSITE FILM FOR INTEGRATED CIRCUITS OF AN INORGANIC AEROGEL AND AN ORGANIC FILLER GRAFTED TO THE INORGANIC MATERIAL"

Insert -- LOW DIELECTRIC CONSTANT COMPOSITE FILM FOR INTEGRATED CIRCUITS OF AN INORGANIC AEROGEL AND AN ORGANIC FILLER GRAFTED TO THE INORGANIC MATERIAL AND METHOD OF FABRICATION --

Column 1, Line 5   Delete: "MATERIAL"
Insert -- MATERIAL AND METHOD OF FABRICATION --

Signed and Sealed this

Seventeenth Day of April, 2001

Attest:

NICHOLAS P. GODICI

Attesting Officer      Acting Director of the United States Patent and Trademark Office